United States Patent
Lee et al.

(10) Patent No.: US 10,266,399 B2
(45) Date of Patent: Apr. 23, 2019

(54) APPARATUS AND METHOD OF MANUFACTURING FOR COMBO MEMS DEVICE ACCOMMODATING DIFFERENT WORKING PRESSURES

(71) Applicant: TAIWAN SEMICONDUCTOR MANUFACTURING COMPANY LTD., Hsinchu (TW)

(72) Inventors: Jiou-Kang Lee, Hsinchu (TW); Wen-Chuan Tai, Hsinchu (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/688,581

(22) Filed: Aug. 28, 2017

(65) Prior Publication Data
US 2019/0062156 A1    Feb. 28, 2019

(51) Int. Cl.
*B81B 7/02* (2006.01)
*B81C 1/00* (2006.01)

(52) U.S. Cl.
CPC ............ *B81C 1/00214* (2013.01); *B81B 7/02* (2013.01); *B81B 2203/0315* (2013.01); *B81C 2201/013* (2013.01); *B81C 2203/0109* (2013.01); *B81C 2203/036* (2013.01)

(58) Field of Classification Search
CPC ........ B81C 1/00214; B81C 2203/0109; B81C 2203/036; B81B 7/02; B81B 2203/0315; H01L 21/187; H01L 21/185; H01L 21/2007; H01L 21/447; H01L 21/76251; H01L 23/3735; H01L 24/01
See application file for complete search history.

(56) References Cited

U.S. PATENT DOCUMENTS

| 2015/0375994 A1* | 12/2015 | Chien | ............... B81C 1/00293 257/43 |
| 2016/0130137 A1* | 5/2016 | Huang | ................... B81B 7/02 257/415 |

* cited by examiner

*Primary Examiner* — Julia Slutsker
(74) *Attorney, Agent, or Firm* — WPAT, P.C., Intellectual Property Attorneys; Anthony King

(57) ABSTRACT

A method of manufacturing a semiconductor device is provided. A first substrate is bonded with a second substrate. The second substrate is recessed to form a first sidewall and a first cavity laterally defined by the first sidewall. The second substrate is recessed to form a second sidewall and a second cavity laterally defined by the second sidewall. The second substrate is bonded with a third substrate at a first barometric pressure thereby forming the first cavity and the second cavity. The first sidewall is recessed to form a channel from the first cavity to an outer surface of the first sidewall. The third substrate is recessed and the first cavity is exposed to a second barometric pressure different from the first barometric pressure.

20 Claims, 18 Drawing Sheets

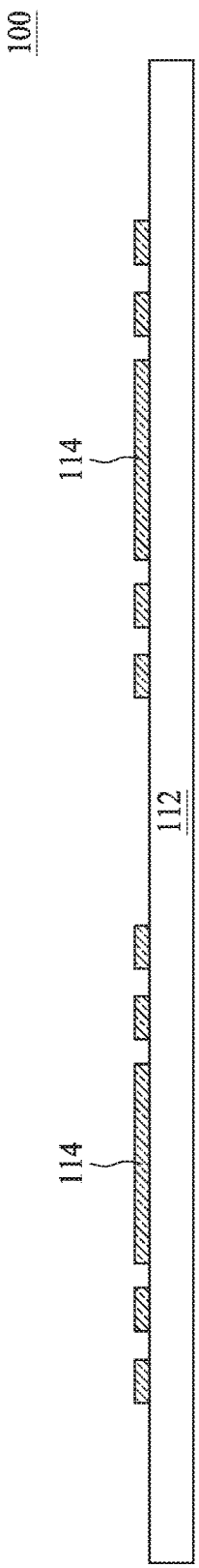

APPARATUS AND METHOD OF MANUFACTURING FOR COMBO MEMS DEVICE ACCOMMODATING DIFFERENT WORKING PRESSURES

BACKGROUND

Micro-electro mechanical system (MEMS) devices have been recently developed and are commonly utilized in electronic equipment. The MEMS device is a micro-sized device, usually between less than 1 micron and several millimeters in size. The MEMS device is fabricated using semiconductive materials to form mechanical and electrical features. The MEMS device may include a number of elements (e.g., stationary or movable elements) for achieving electro-mechanical functionality. MEMS devices are widely used in various applications, such as motion sensors, pressure sensors, printer nozzles, inertial sensors, accelerometers and gyroscopes. Moreover, MEMS applications are extended to optical applications, such as movable mirrors, and radio frequency (RF) applications, such as RF switches or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A through 3K are cross-sectional views of intermediate structures for a method of manufacturing a MEMS device, in accordance with some embodiments.

DETAILED DESCRIPTION

Figure 1A:
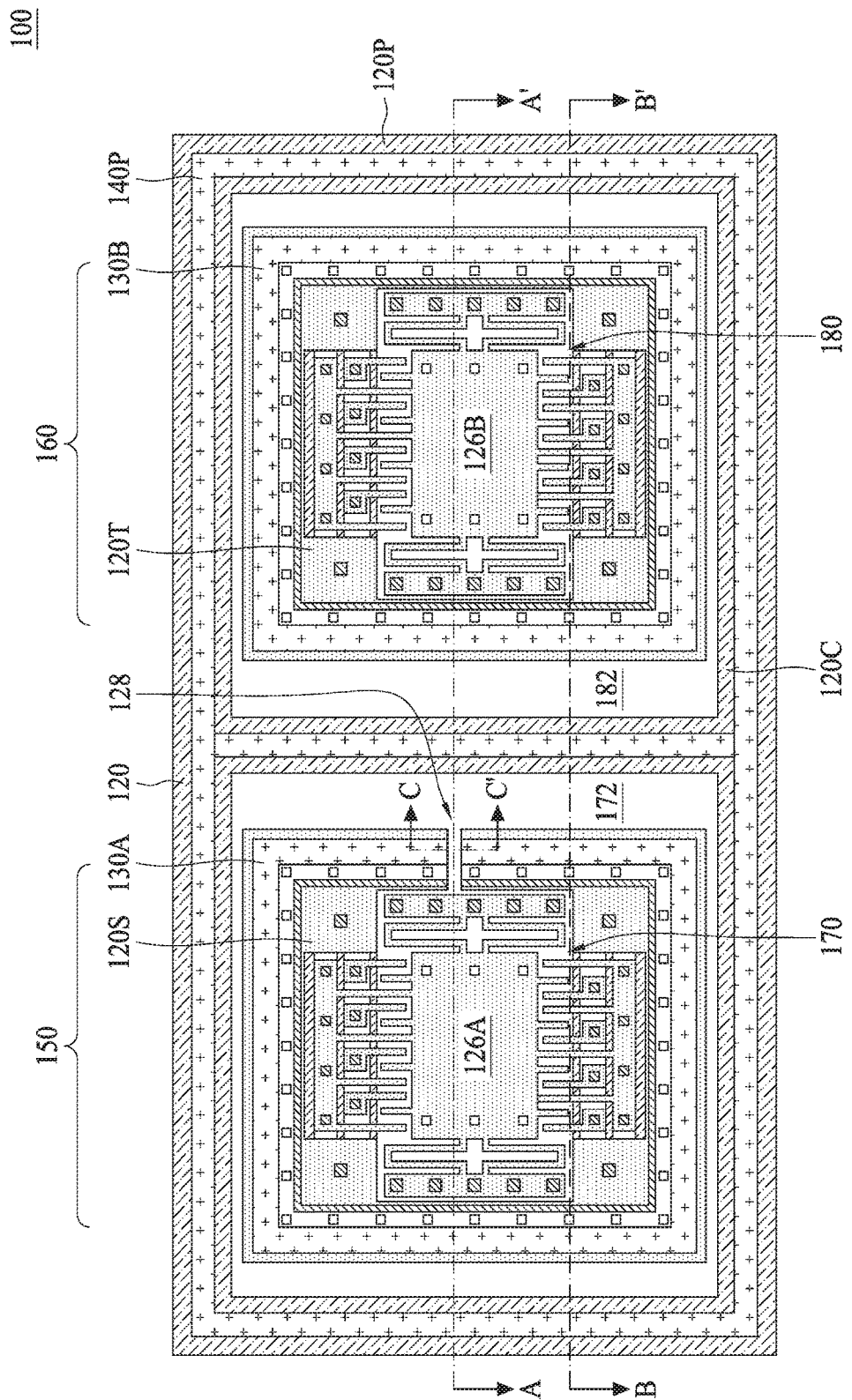
FIGS. 1A and 1B are a plan view and a cross-sectional view, respectively, of a semiconductor MEMS device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor micro-electro mechanical system (MEMS) device and its associated manufacturing operations according to various embodiments. Specifically, a MEMS combo device is illustrated as an exemplary application herein, where two MEMS sensors performing different sensing tasks are formed on a common wafer and manufactured using a single operation flow. Different MEMS sensors may have different requirements, such as barometric pressure, temperature, materials, etc. In the present disclosure, at least two sensors are integrated to perform sensing at different barometric pressures. An air channel is introduced to one of the two sensors while keeping the other sealed so as to expose the two sensors to different pressures, such as an atmospheric pressure, respectively. As a result, manufacturing cost and device size are reduced.

FIG. 1A is a plan view of a semiconductor MEMS device 100, in accordance with some embodiments. In some embodiments, the MEMS device 100 is a sensor, such as a barometric pressure sensor, a motion sensor, an accelerometer, a gyroscope, or the like. In some embodiments, the MEMS device 100 includes an optical element for transmitting or receiving optical signals (e.g., an optical waveguide), or an electromagnetic component for processing electromagnetic waves (e.g., an RF circuit). Referring to FIG. 1A, the MEMS device 100 is a combination device ("combo") and includes at least two MEMS component devices, i.e., a first component device 150 and a second component device 160. The first component device 150 is formed by a first substrate 110 (not shown in FIG. 1A, but illustrated in subsequent figures), a second substrate 120 and a first cap substrate 130A. A first cavity 170 is formed from and defined by the first substrate 110, the second substrate 120 and the first cap substrate 130A. The first cap substrate 130A covers and seals the first cavity 170. FIG. 1A only shows portions of the first cap substrate 130A that are bonded with the second substrate 120 for clarity.

At least one first sensing element 126A is formed in the first cavity 170. The first sensing element 126A is configured to perform sensing of external stimuli, such as temperature, barometric pressure, liquid pressure, speed, acceleration, orientation, inertia, or combinations thereof. In some embodiments, the first sensing element 126A comprises a conductive material, such as a metallic material (e.g., copper, tungsten, aluminum, or the like) or doped polysilicon. In some embodiments, the first sensing element 126A comprises a flexible portion configured to move or bend in response to external stimuli and provide an electrical signal according to such movement. In some embodiments, the first sensing element 126A is configured to provide sensing data based on variations of physical characteristics or electrical properties instead of physical movements, such as resistance, inductance, or capacitance based on external stimuli. In some embodiments, the first sensing element 126A comprises a micro-actuator, a valve, a pump, a flow guide, or the like. In some embodiments, the first sensing element 126A may include a proof mass, a flexible membrane, a spring, an electrode, a temperature-sensitive resistor, a pressure-sensitive resistor, combinations thereof, or the like.

In some embodiments, the first sensing element 126A is formed of a semiconductor material, such as silicon, germanium, or the like. In some embodiments, the first sensing element 126A comprises a material that is the same as that for the second substrate 120. In some embodiments, the second substrate 120 comprises a first sidewall 120S defining the first cavity 170, wherein the first sensing element 126A is enclosed by the first sidewall 120S. In some embodiments, the first sidewall 120S is contiguous in shape and surrounds the first sensing element 126A. In some embodiments, the first sidewall 120S is separate from any of the first sensing elements 126A in the first cavity 170. In some embodiments, the first sidewall 120S does not include any sensing element of the first component device 150.

The second component device 160 may share some of the materials or configurations of the first component device 150. The second component device 160 is comprised of the first substrate 110, the second substrate 120 and a second cap substrate 130B. A second cavity 180 is formed from and defined by the first substrate 110, the second substrate 120 and the second cap substrate 130B. The second cap substrate 130B covers the second cavity from above whereas only those portions of the second cap substrate 130B that are bonded with the second substrate 120 are illustrated. In some embodiments, the first cap substrate 130A and the second cap substrate 130B may be formed from a single third substrate 130 (not shown in FIG. 1A), as described in subsequent paragraphs.

At least one second sensing element 126B is formed in the second cavity 180. The second sensing element 126B is configured to perform sensing of external stimuli, such as temperature, barometric pressure, liquid pressure, speed, acceleration, orientation, inertia, or combinations thereof. In some embodiments, the second sensing element 126B may perform functions similar to those of the first sensing element 126A. In some embodiments, the first sensing element 126A and the second sensing element 126B perform different sensing tasks. In some embodiments, a subset of the first sensing elements 126A in the first component device 150 may be the same as a subset of the second sensing elements 126B in the second component device 160.

In some embodiments, the second sensing element 126B is formed of a semiconductor material, such as silicon, germanium, or the like. In some embodiments, the second sensing element 126B comprises a material that is the same as that used for the second substrate 120. In some embodiments, the second substrate 120 comprises a second sidewall 120T defining the second cavity 180. In some embodiments, the second sensing element 126B is enclosed by the second sidewall 120T. In some embodiments, the second sidewall 120T is contiguous in shape and surrounds the second sensing element 126B. In some embodiments, the second sidewall 120T is separate from any of the second sensing elements 126B in the second cavity 180. In some embodiments, the second sidewall 120T does not include any sensing element of the second component device 160.

In some embodiments, the first component device 150 is operated at a first barometric pressure, wherein the first barometric pressure is different from a second barometric pressure at which the second component device 160 is operated. In some embodiments, the first component device 150 is an accelerometer operating at an atmospheric pressure whereas the second component device 160 is a gyroscope operating at a vacuum. In some embodiments, the first barometric pressure of the first component device 150 is higher than the second barometric pressure of the second component device 160.

In some embodiments, the first component device 150 includes a channel 128 formed on the first sidewall 120S. In some embodiments, the channel 128 communicates with the first cavity 170 at an outer surface of the first sidewall 120S. In some embodiments, the channel 128 is an air channel for balancing the pressure between the first cavity 170 and the ambient atmosphere. In some embodiments, the channel 128 is disposed laterally adjacent to the first sensing element 126A. In some embodiments, the channel 128 has a substantially consistent width as viewed from above. In contrast, the second component device 160 is free of any channel in order to maintain the airtight condition (e.g., vacuum or high vacuum) of the second cavity 180. In some embodiments, the second sidewall 120T is free of any channel or conduit introducing fluid or gas into the second cavity 180. (Throughout the present disclosure, the term "high vacuum" or "substantial vacuum" may refer to a low barometric pressure below about $10^{-4}$ Torr. In some examples, the term "high vacuum" or "substantial vacuum" may refer to a low barometric pressure below about $10^{-6}$ Torr.)

In some embodiments, the semiconductor MEMS device 100 further includes a fourth substrate 140 bonded with the second substrate 120. In some embodiments, the fourth substrate 140 has a material similar to that of the second substrate 120 or that of the first cap substrate 130A. The fourth substrate 140 has periphery portions 140P covering the first component device 150 and the second component device 160. In some embodiments, a third cavity 172 is formed between the fourth substrate 140, the second substrate 120 and the first cap substrate 130A. Similarly, a fourth cavity 182 is formed between the fourth substrate 140, the second substrate 120 and the second cap substrate 130B. In some embodiments, the fourth substrate 140 includes a central portion 140C separating the third cavity 172 from the fourth cavity 182. In some embodiments, the first cavity 170 is connected to the third cavity 172 through the channel 128. In some embodiments, the first cavity 170 and the third cavity 172 have a same barometric pressure. In some embodiments, the second cavity 180 is isolated from the fourth cavity 182. In some embodiments, the second cavity 180 and the fourth cavity 182 have different barometric pressures.

Figure 1B:
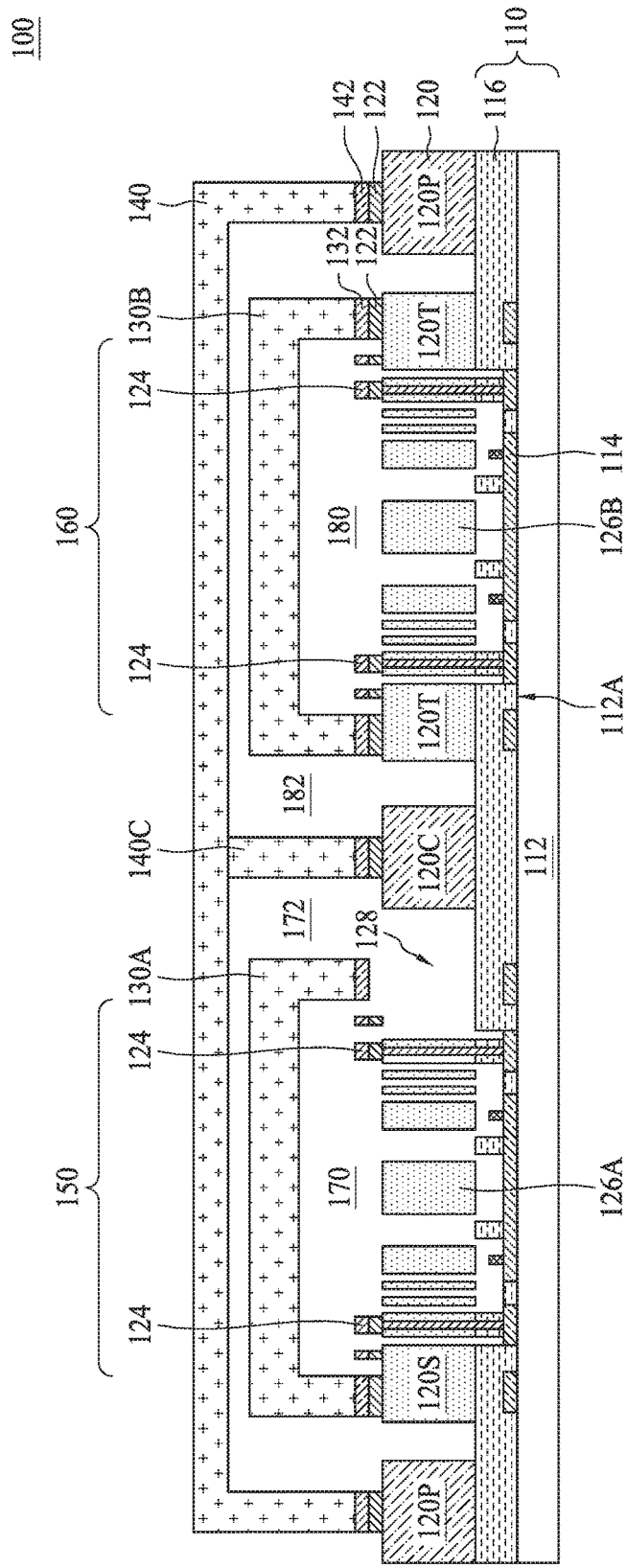

FIG. 1B is a cross-sectional view of the semiconductor MEMS device 100 in FIG. 1A taken along sectional line AA', in accordance with some embodiments. The first substrate 110 includes a semiconductor material 112 and an interlace layer 116 disposed over the semiconductor material 112. The semiconductor material 112 may be a wafer or a bulk substrate. In some embodiments, the semiconductor material 112 may include silicon, germanium, silicon germanium, silicon carbide, gallium arsenide, or the like. Alternatively, the semiconductor material 112 includes another elementary semiconductor, such as a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the semiconductor material 112 is a semiconductor-on-insulator (SOI). In other alternatives, the semiconductor material 112 may include a doped epitaxial layer, a gradient semiconductor layer, and/or a semiconductor layer overlaying another semiconductor layer of a different type, such as a silicon layer on a silicon germanium layer. The semiconductor material 112 may be doped with an N-type dopant, such as arsenic, phosphor, or the like, or may be doped with a P-type dopant, such as boron or the like.

In some embodiments, the semiconductor material 112 includes semiconductor components (not shown) formed on a front surface 112A. The semiconductor components may include doped regions, conductive features, and dielectric materials. In some embodiments, such semiconductor components are configured to form passive elements, e.g., a capacitor, an inductor, a diode, combinations thereof, or the like. In some embodiments, the components are arranged to form active circuitries such as bipolar junction transistors, field effect transistors, or the like.

In some embodiments, the first substrate 110 may include an interconnect layer (not separately shown) over the foresaid semiconductor components of the semiconductor material 112. The interconnect layer is configured to electrically couple the semiconductor components in the semiconductor material 112 with external devices, such as the second substrate 120. In some cases, the interconnect layer redistributes the connection layout between the first substrate 110 and the second substrate 120, and thus is also termed a "redistribution layer" (RDL). The interconnect layer may include layered conductive lines extending along a horizontal direction where the conductive lines are interconnected through adjacent vertical conductive vias or contacts. The conductive lines and conductive vias/contacts are encapsulated and electrically insulated by an electrically insulating material or an inter-metal dielectric (IMD).

Referring to FIG. 1B, several bond pads 114 are disposed over the semiconductor material 112. In some embodiments, the bond pads 114 are formed in a topmost layer of the interconnect layer in the first substrate 110. In some embodiments, the bond pads 114 to the right of a central portion 120C of the second substrate 120 are configured to electrically couple the first substrate 110 with the second component device 160 or the second sensing element 126B. In some embodiments, the bond pads 115 to the left of the central portion 120C are configured to electrically couple the first substrate 110 with the first component device 150 or the first sensing element 126A. In some embodiments, the bond pads 114 are formed of conductive materials, such as copper, tungsten, aluminum, silver, gold, combinations thereof, or the like.

In some embodiments, an interface layer 116 is formed over the semiconductor material 112. In some embodiments, the interface layer 116 couples the first substrate 110 with the second substrate 120. In some embodiments, the interface layer 116 covers some of the bond pads 114 and some of the bond pads 114 may be at least partially exposed through the interface layer 116. In some embodiments, the interface layer 116 has recesses on a side facing the second substrate 120. The recesses may expose a portion of the bond pads 114. The recesses are formed such that some movable features of the second substrate 120 can move freely without hitting the first substrate 110. In some embodiments, the interface layer 116 comprises dielectric materials, such as silicon oxide, silicon nitride, silicon oxynitride, nitrogen-doped oxide, nitrogen-bearing oxide, or the like. In some embodiments, the interface layer 116 includes a polymeric material selected from a group consisting of polyimide (PI), polybenzoxazole (PBO), benzocyclobuten (BCB), epoxy, or the like.

The second substrate 120 is disposed over the first substrate 110. In some embodiments, the first substrate 110 is bonded to the second substrate 120 through the interface layer 116. The second substrate 120 includes a semiconductor material such as silicon or germanium. In some embodiments, the second substrate 120 may include other semiconductor materials, such as silicon germanium, silicon carbide, gallium arsenide, or the like. The second substrate 120 may be formed of a material that is the same as that used in the semiconductor material 112.

A first bonding layer 122 is disposed over the second substrate 120. The bonding layer 122 is a patterned layer in which bond pads 122 may be formed on the top surface of the second substrate 120 through a patterning operation. The first bonding layer 122 may be formed of a conductive material, such as copper, tungsten, aluminum, silver, gold, combinations thereof, or the like. A second bonding layer 132 on the third substrate 130 is disposed over the first bonding layer 122. The second bonding layer 132 may be formed of a conductive material, such as germanium, copper, tungsten, aluminum, silver, gold, combinations thereof, or the like. In some embodiments, eutectic bonding is utilized to bond the second substrate 120 and the third substrate 130 through the bonding layers 122 and 132 where the materials selected for the bonding layers 122 and 132 may be AlCu and germanium, respectively.

In some embodiments, a protection layer 124 is disposed on portions of the first bonding layer 122. The protection layer 124 is patterned, thereby covering portions of the first bonding layer 122 that are not bonded with the second bonding layer 132. In some embodiments, the protection layer 124 is patterned following the pattern of the sensing element 126A or 126B directly coupled thereto. In some embodiments, the protection layer 124 has a circular shape or a polygonal shape as viewed from above. The protection layer 124 may comprise a ceramic material, such as titanium nitride, titanium diboride, zirconium diboride, combinations thereof, or the like.

The first cap substrate 130A and the second cap substrate 130B are bonded to the second substrate 120 through the second bonding layer 132. In some embodiments, the first cap substrate 130A or the second cap substrate 130B has a circular shape or a polygonal shape as viewed from above. The first cap substrate 130A or the second cap substrate 130B may include a semiconductor material such as silicon or germanium. In some embodiments, the first cap substrate 130A or the second cap substrate 130B may include other semiconductor materials, such as silicon germanium, silicon carbide, gallium arsenide, or the like. The first cap substrate 130A or the second cap substrate 130B may be formed of a material that is the same as that used in the semiconductor material 112 or the second substrate 120.

The channel 128 is illustrated on a right-hand side of the first component device 150. Since the cross-sectional view of FIG. 1B is taken where the channel 128 is present, portions of the first sidewall 120S are absent at the channel 128. The first cavity 170 communicates with the third cavity 172 through the channel 128 accordingly. In some embodiments, the channel 128 extends through the height of the second substrate 120. In other words, the material of second substrate 120 is removed completely along a vertical direction. In some embodiments, the channel 128 extends through the first bonding layer 122 and reaches the second bonding layer 132. In some embodiments, the channel 128 exposes a portion of the second bonding layer 132. In some embodiments, the channel 128 reaches the interface layer 116 and exposes a portion of the interface layer 116. The second sidewall 120T of the second substrate 120 seals the second cavity 180 in conjunction with the first substrate 110 and the second cap substrate 130B.

The fourth substrate 140 is bonded with the first bonding layer 122 through a third bonding layer 142. In some embodiments, the third bonding layer 142 has a material and configurations similar to those of the first bonding layer 122 or the second bonding layer 132. In some embodiments, the third bonding layer 142 is distributed on a periphery of the fourth substrate 140. In some embodiments, the fourth substrate 140 includes a periphery portion 140P laterally surrounding the first sidewall 120S or the second sidewall 120T in conjunction with the central portion 140C. In some embodiments, the second substrate 120 is bonded to the fourth substrate 140 at the periphery portion 140P and the central portion 140C. The third cavity 172 and the fourth cavity 182 are formed accordingly. In some embodiments, the second substrate 120 includes a central portion 120C bonded with the corresponding central portion 140C to separate the third cavity 170 from the fourth cavity 182.

Figure 1C:
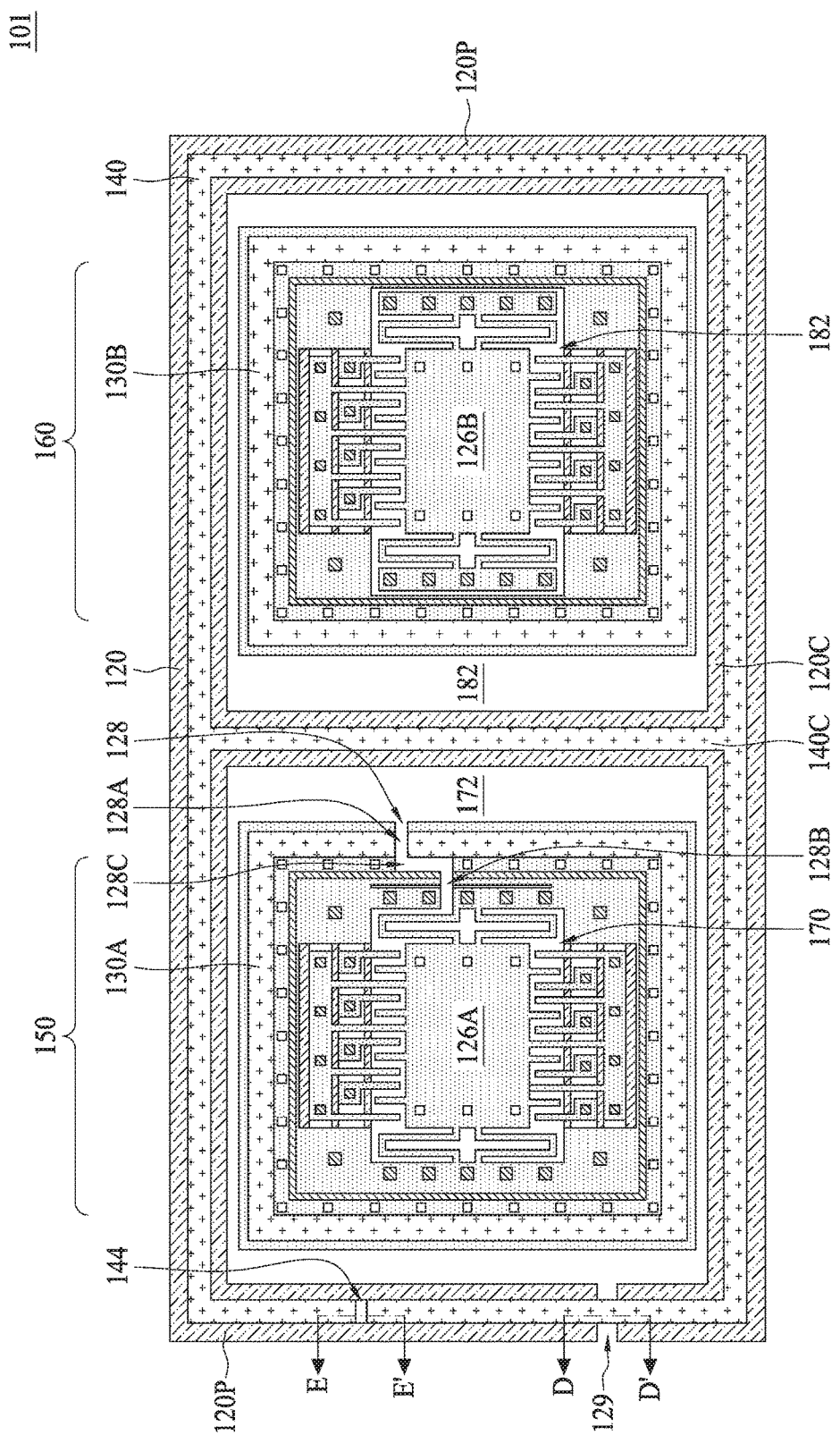
FIG. 1C is a plan view of a semiconductor MEMS device, in accordance with some embodiments.

FIG. 1C is a plan view of a semiconductor MEMS device 101, in accordance with some embodiments. The semiconductor MEMS device 101 is similar to the semiconductor MEMS device 100, except that the channel of the semiconductor MEMS devices 101 may include different configurations. In some embodiments, the channel 128 includes at least one corner 128C. In some embodiments, the channel 128 comprises multiple sections with different orientations. In some embodiments, the sections may include different widths. In the depicted embodiment, the channel 128 has a first section 128A communicating with the third cavity 172 via a first end (e.g., outlet) and a second section 128B communicating with the first cavity 170 via a second end (e.g., inlet). In some embodiments, the first section 128A may be parallel with but not aligned with the second section 128B. In some embodiments, the channel 128 may have sections substantially perpendicular to each other.

In some embodiments, the fourth substrate 140 may include another channel 144. In some embodiments, the channel 144 communicates with the third cavity 172 with the ambient atmosphere. In some embodiments, the channel 144 communicates with the third cavity 172 with an outer surface of the fourth substrate 140. In some embodiments, the channel 144 may include a shape or configuration similar to those of the channel 128. In cases where the channel 144 is present, the first cavity 170 may be exposed to the ambient atmosphere through the third cavity 172. In some embodiments, the fourth substrate 140 provides enhanced protection and durability of the semiconductor MEMS device 100 or 101 against foreign stress or shock. Keeping the third cavity 172 isolated from ambient environments can provide better structural integrity of the fourth substrate 140. Moreover, a hermitical fourth substrate 140 can prevent undesired particles from contaminating the sensing elements in the MEMS device 100 or 101. Additionally, constructing the channel 144 on the fourth substrate 140 may allow for greater manufacturing flexibility of the first component device 150. For example, it may be necessary to keep the first component device 150 at vacuum prior to bonding with the hermitical fourth substrate 140. The first cavity 170 or the third cavity 172 may be kept at high vacuum after the bonding of the hermitical fourth substrate 140. Under such circumstance, given the presence of the channel 144, all of the bonding operations for the first cap substrate 130A, the second cap substrate 130B, and the fourth substrate 140 can still be performed at high vacuum. When the MEMS device assembly 100 or 101 is formed, the first cavity 170 can still be exposed to ambient barometric pressure through the channel 144.

The air conducting mechanism may be alternatively configured. Referring to FIG. 1C, a channel 129 may be, instead of the channel 144, disposed on a peripheral portion 120P on a left-side of the MEMS device 101. The channel 129 cuts through a portion of the peripheral portion 120P. In some embodiments, the channel 129 and the channel 144 have similar functions. The shapes and configurations of the channel 129 are similar to those of the channel 128 or 144. In addition, like the channel 128, the channel 129 may be formed simultaneously with the formation of the first sidewall 120S, the second sidewall 120T, the first sensing element 126A or the second sensing element 126B. In some embodiments, the channel 129 may be formed in a single recessing operation that forms the central portion 120C or the peripheral portions 120P. In some embodiments, the channel 129 communicates with the first cavity 170 though the third cavity 172.

Figure 1F:
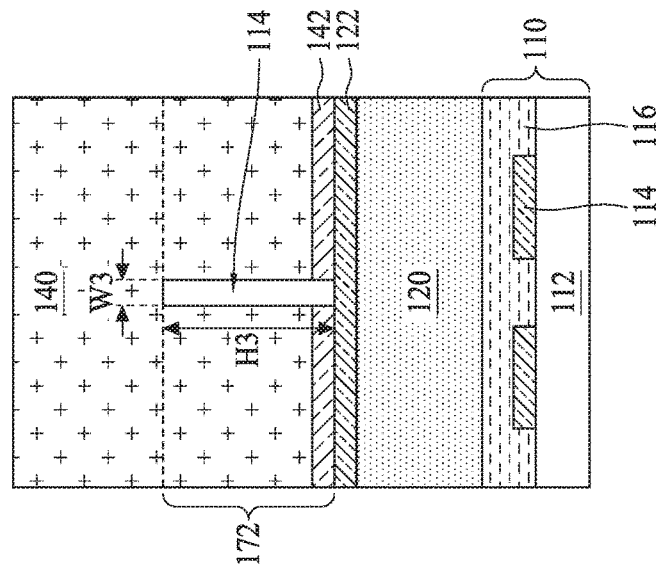
FIGS. 1D through 1F are enlarged cross-sectional views displaying a channel of a semiconductor MEMS device, in accordance with some embodiments.
Figure 1E:
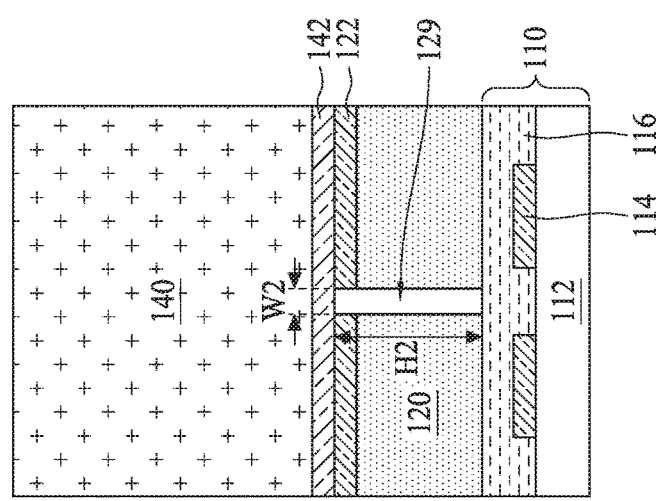
Figure 1D:
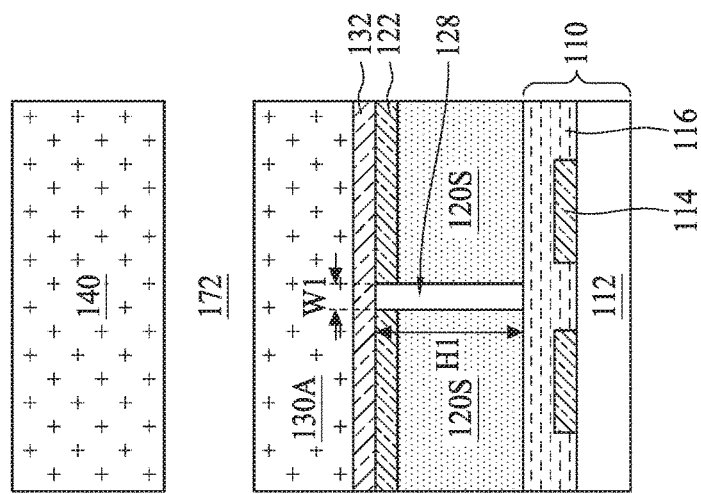

FIGS. 1D through 1F are enlarged cross-sectional views displaying channels 128 and 144, respectively, of the semiconductor MEMS devices in FIGS. 1A and 1C, in accordance with some embodiments. FIGS. 1D, 1E and 1F are taken along sectional line CC' in FIG. 1A and sectional lines DD' and EE' in FIG. 1C, respectively. Referring to FIG. 1D, the channel 128 is formed between the interface layer 116 and the second bonding layer 132. In some embodiments, the channel 128 extends through the first bonding layer 122. The height H1 of the channel 128 may be substantially equal to the sum of the thickness of the first bonding layer 122 and the height of the first sidewall 120S of the second substrate 120. In some embodiments, the channel 128 exposes a portion of the second bonding layer 132. In some embodiments, the channel 128 reaches the interface layer 116 and may expose a portion of the interface layer 116. In some embodiments, the channel 128 may be kept as narrow as possible so that the structural integrity of the first sidewall 120S, or air flow within the first cavity 170, is not adversely impacted due to the channel shape. In some embodiments, although not separately shown, the channel may be also disposed on a top surface of the first cap substrate 130A, e.g., directly over the sensing element 126A. In some examples, the channel 128 constructed on the sidewall 120S may provide air flow with less fluctuation as compared to a channel formed directly over the sensing element 126A.

Referring to FIG. 1E, the channel 129 is formed between the interface layer 116 and the second bonding layer 142. In some embodiments, the channel 129 extends through the first bonding layer 122. The height H2 of the channel 129 may be substantially equal to the sum of the thickness of the first bonding layer 122 and the height of the first sidewall 120S of the second substrate 120. In some embodiments, the channel 129 exposes a portion of the third bonding layer 142. In some embodiments, the channel 129 reaches the interface layer 116 and may expose a portion of the interface layer 116. In some embodiments, the channel 129 is a width or height equal to that of the channel 128.

Referring to FIG. 1F, the channel 144 is formed on a sidewall of the fourth substrate 140. In some embodiments, the channel 144 has a top substantially level with the top surface of the fourth cavity 172. In some embodiments, the channel 144 extends through the second bonding layer 132 and may expose a portion of the first bonding layer 122. In some embodiments, the channel 144 may be kept as narrow as possible so that the structural integrity and protection function of the fourth substrate 140 may be substantially maintained. In some embodiments, the height H3 of the channel 144 may be substantially equal to the sum of the thickness of the third bonding layer 142 and the height of the sidewall of the fourth substrate 140 corresponding to the third cavity 172.

Figure 2A:
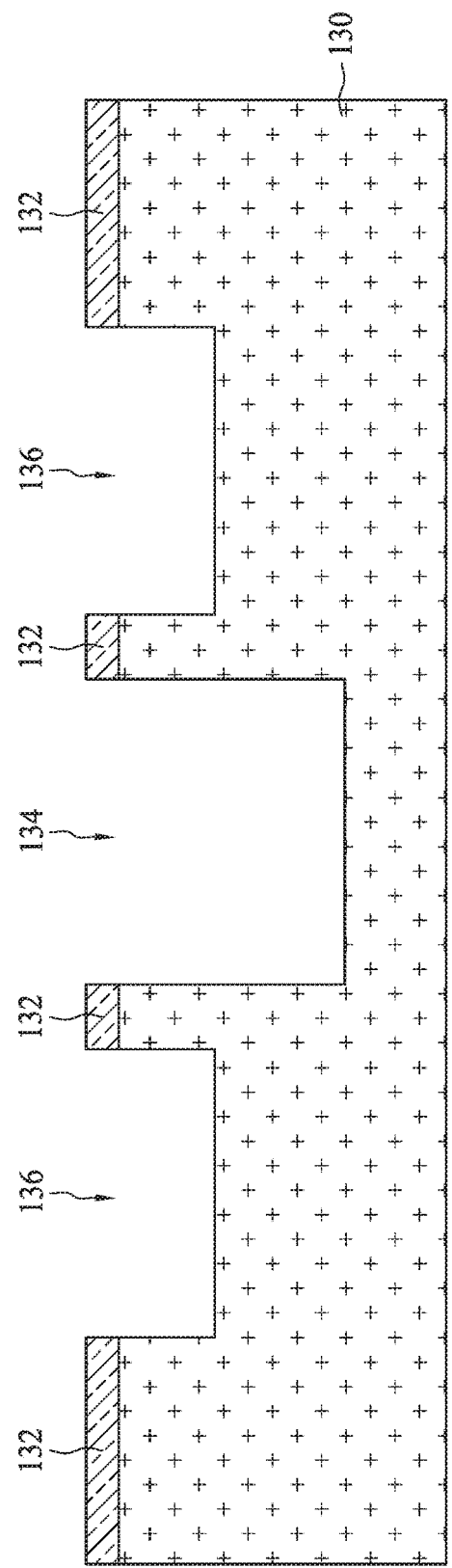
FIGS. 2A through 2C are cross-sectional views of intermediate structures for a method of manufacturing a MEMS device, in accordance with some embodiments.
Figure 2B:
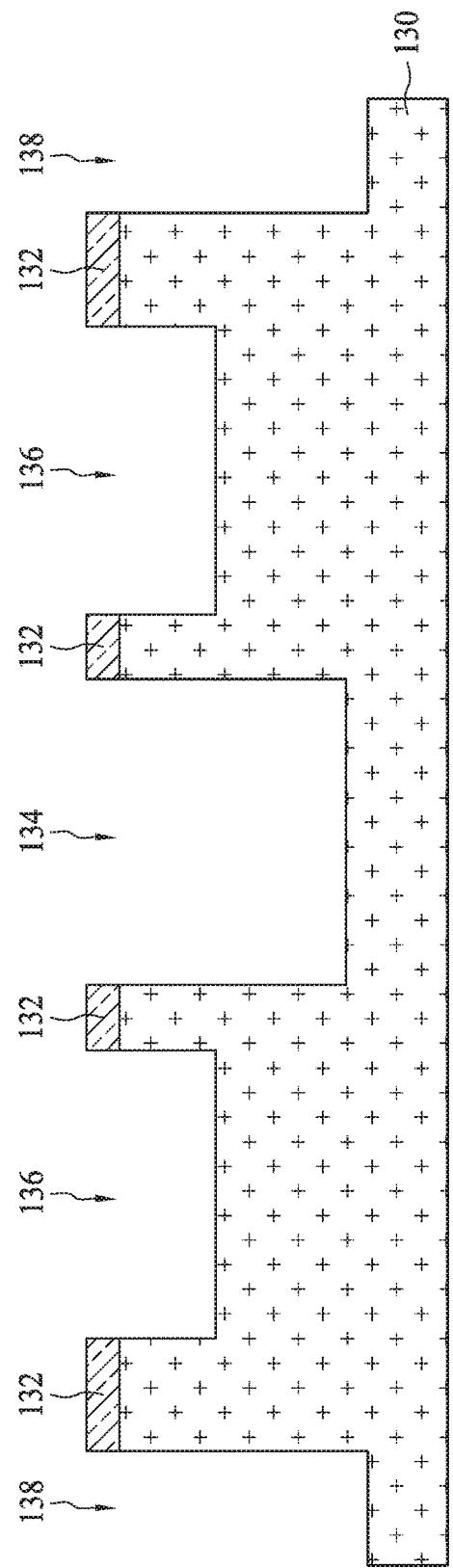
Figure 2C:
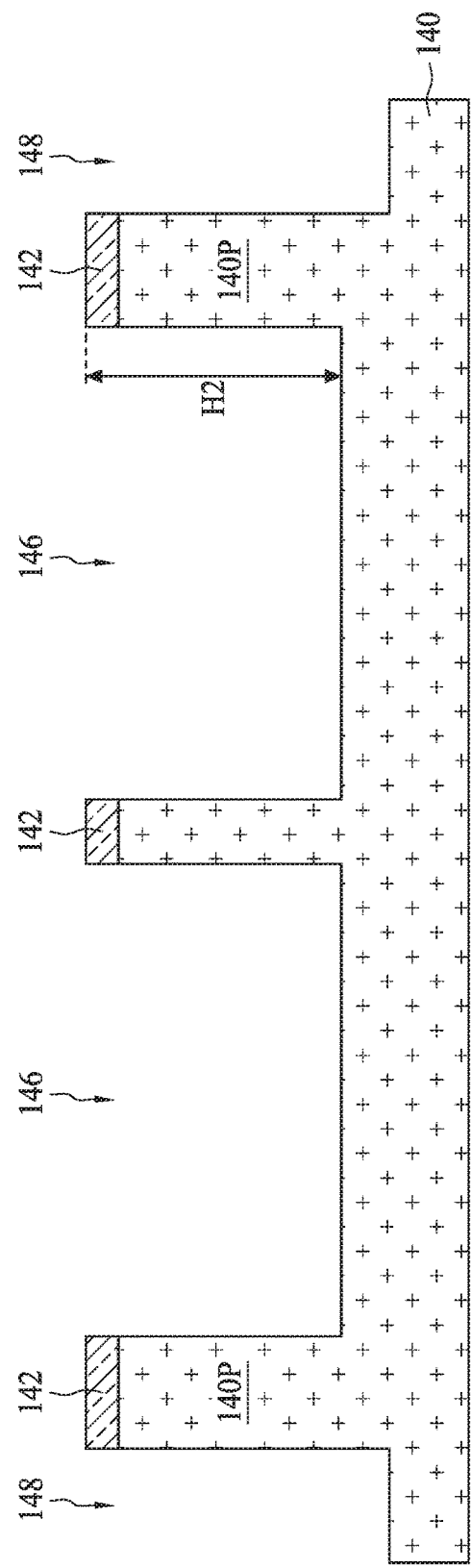

FIGS. 2A through 2C are cross-sectional views of intermediate structures for a method of manufacturing the MEMS device 100, in accordance with some embodiments. Referring to FIG. 2A, a bulk semiconductor material is provided or received as a third substrate 130. A second bonding layer 132 is formed over the third substrate 130. The second bonding layer 132 is formed by initially depositing a conductive material over the third substrate 130, followed by a lithographic process for patterning the conductive material into desirable shapes, such as a bonding rim or bond pads. The deposition of the second bonding layer 132 can be carried out using any of a variety of techniques, including chemical vapor deposition (CVD), LPCVD (low-pressure CVD), PECVD (plasma-enhanced CVD), physical vapor deposition (PVD), sputtering, or the like.

Subsequently, recesses 134 and 136 are formed on the top surface of the third substrate 130. In an exemplary operation, a photoresist (not shown) is patterned over the second bonding layer 132 and serves as a masking layer. An etching operation is performed to recess the third substrate 130 among portions of the second bonding layer 132. The etching operation may include a dry etching, a wet etching, or a reactive ionic etching (RIE) operation. The photoresist is stripped after the recesses 134 and 136 are formed. In some embodiments, multiple etching operations or different etching recipes may be used to form different recess depths among recesses 134 and 136. In an embodiment, the recess 134 has a depth greater than the depth of each of the recesses 136.

Referring to FIG. 2B, recesses 138 are formed on the third substrate 130. The methods for forming the recesses 138 may be similar to those used in forming the recesses 134 and 136. The recesses 138 may be situated at a periphery of the third substrate 130. In some embodiments, each of the recesses 138 has a depth greater than that of each of the recesses 136.

FIG. 2C illustrates that a fourth substrate 140 is provided. Recesses 146 and 148 are formed using operations similar to those used for forming recesses 134, 136 and 138. A third bonding layer 142 is deposited over the fourth substrate 140. A third bonding layer 142 is formed over the fourth substrate 140. In some embodiments, the recesses 146 have depths substantially equal to the depths of the recesses 148. The material and manufacturing operations for the fourth substrate 140 and the third bonding layer 142 are similar to those used in the third substrate 130 and the second bonding layer 132. Referring to FIG. IF and FIG. 2C, in some embodiments, the fourth substrate 140 is further recessed at a periphery portion 140P to form a channel 144. The channel 144 cuts through the periphery portion 140P in a thickness direction from one side facing one recess 148 to the other side facing one recess 146. In some embodiments, the channel 144 extends through the third bonding layer 142. In some embodiments, the channel 144 has a height H3 substantially equal to the sum of the thickness of the third bonding layer 142 and the depth of the recess 146 (corresponding to the height of a subsequently formed third cavity 172).

Figure 3B:
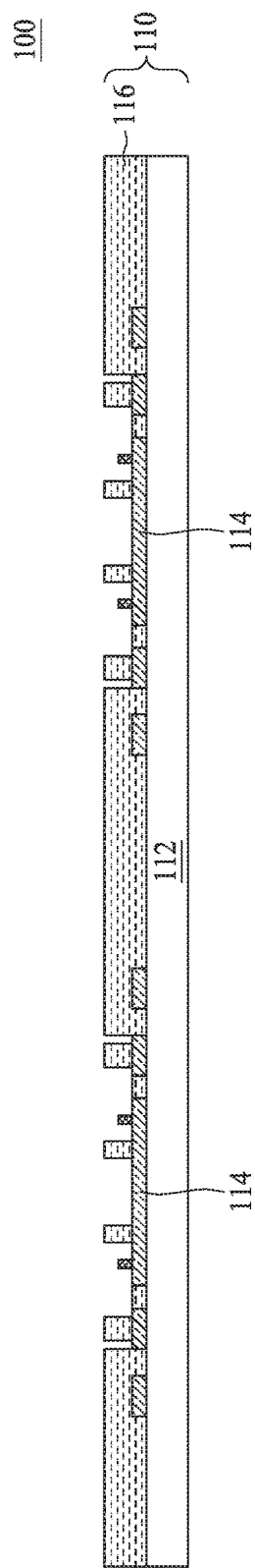
Figure 3C:
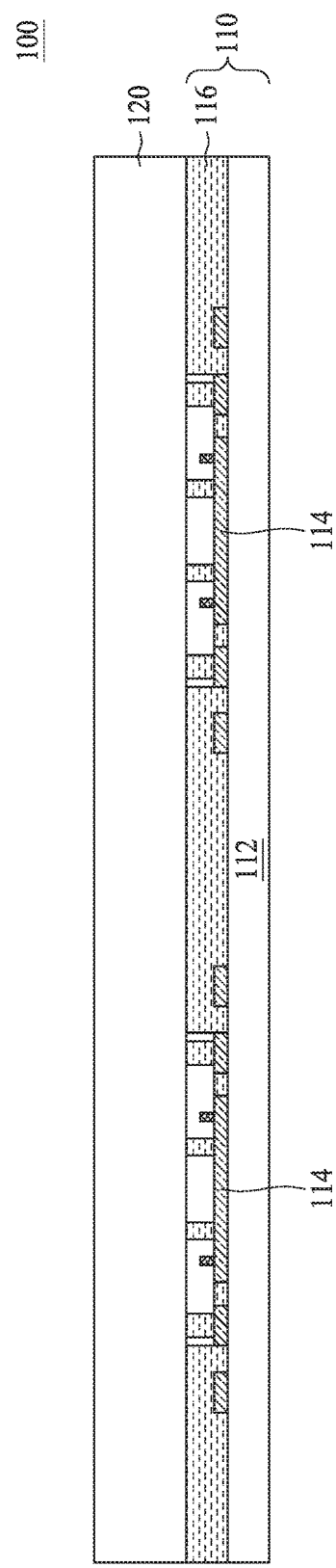
Figure 3D:
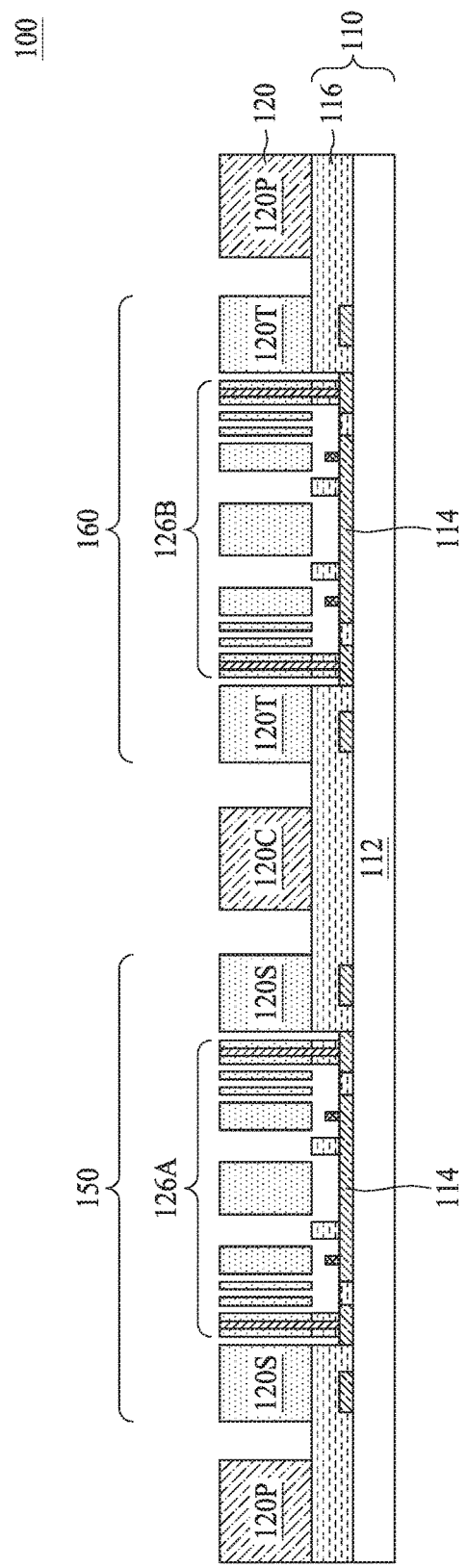
Figure 3E:
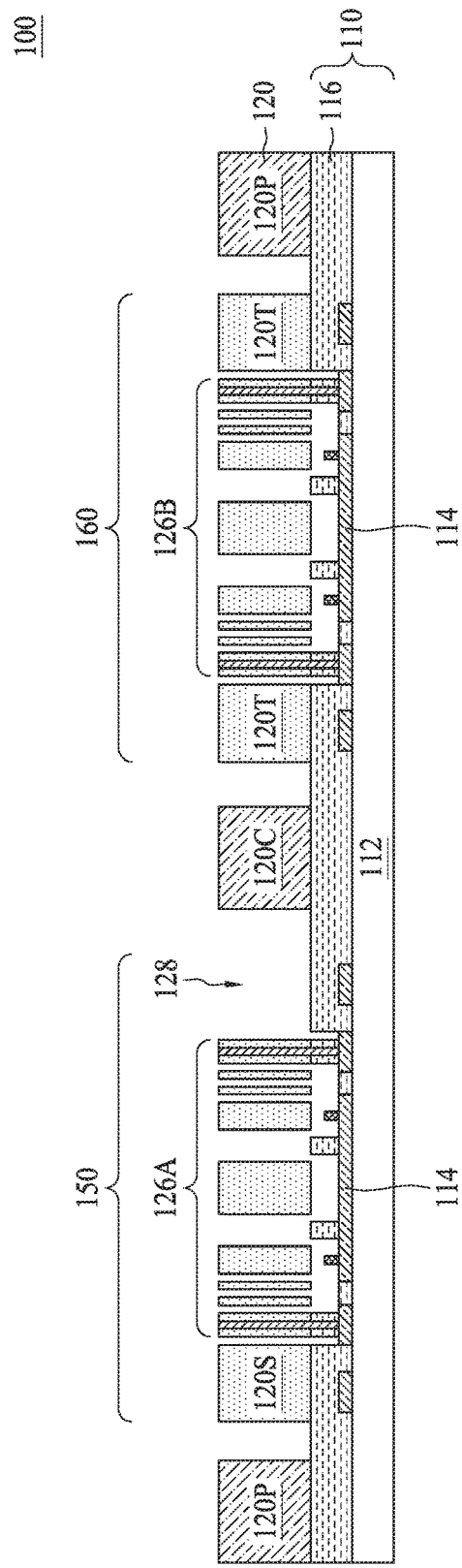
Figure 3F:
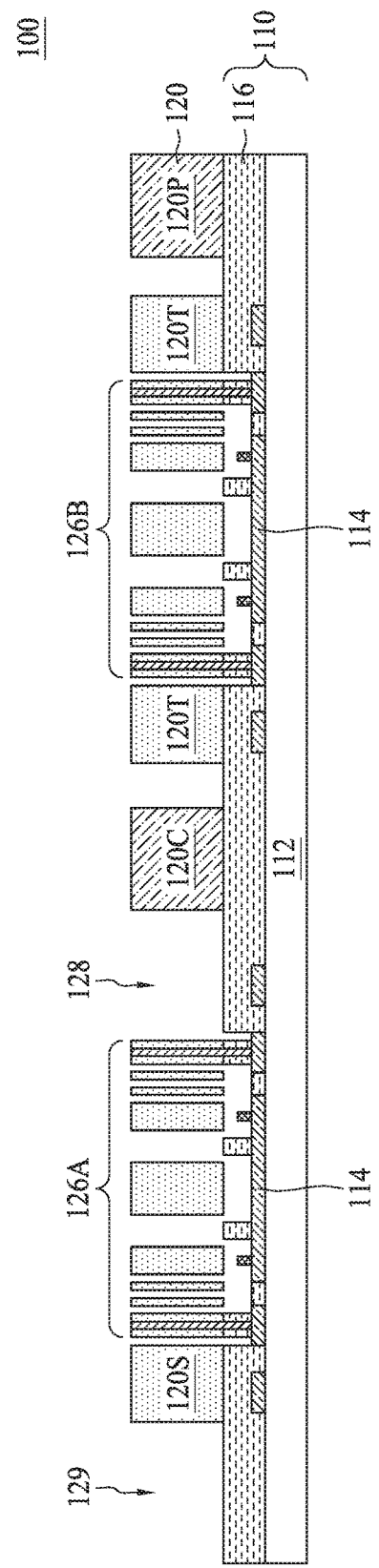

FIGS. 3A through 3K are cross-sectional views of intermediate structures for a method of manufacturing the MEMS device 100, in accordance with some embodiments. All of the figures are taken along sectional line BB' of the MEMS device 100 in FIG. 1A except that FIGS. 3E and 3F are taken along sectional line AA'. FIG. 3A shows the provision of the semiconductor material 112 and the formation of a conductive layer over the semiconductor material 112, where the conductive layer is patterned into bond pads 114. The manufacturing methods of the bond pads 114 may be similar to those of the second bonding layer 132.

In FIG. 3B, an interface layer 116 is deposited over the semiconductor material 112, thereby constituting a first substrate 110 along with the bond pads 114. The interface layer 116 may be formed by a suitable technology, such as thermal oxidation, spin-on coating, CVD, PECVD, atomic layer deposition (ALD), PVD, and the like. In some embodiments, an etching operation may be performed on the interface layer 116 to expose a portion of the bond pads 114. Next, a second substrate 120 is bonded with the first substrate 110 in FIG. 3C. The bonding method may include compressive bonding, fusion bonding, or solid-liquid interdiffusion bonding (SLID). In some embodiments, a thermal annealing is involved in the bonding operation to fuse the second substrate 120 where it makes contact with the interface layer 116.

Referring to FIG. 3D, the second substrate 120 is etched to form a first component device 150 and a second component device 160. At the same time, a central portion 120C and periphery portions 120P that surround the first component device 150 and the second component device 160 are formed. A first sidewall 120S and one or more first sensing elements 126A for the first component device 150 are formed during the etch operation. Similarly, a second sidewall 120T and one or more second sensing elements 126B for the second component device 160 are also formed. In some embodiments, the central portion 120C is connected to the periphery portions 120P, as illustrated in FIG. 1A. In some embodiments, the second substrate 120 is so etched that each of the first sidewall 120S and the second sidewall 120T is disconnected from the central portion 120C and the periphery portions 120P. In some embodiments, the first sidewall 120S laterally surrounds yet is spaced apart from the first sensing elements 126A. In some embodiments, the first sidewall 120S makes contact with at least one of the first sensing elements 126A. In some embodiments, the second sidewall 120T laterally surrounds yet is spaced apart from the second sensing elements 126B. In some embodiments, the second sidewall 120T makes contact with at least one of the second sensing elements 126B.

In some embodiments, at least one component of the first sensing elements 126A or the second sensing elements 126B includes a conductive material. In some embodiments, such conductive component is formed by receiving an ion implantation operation. For example, a doped polysilicon component is formed which has an N-type or a P-type dopant. In some embodiments, such conductive component is formed by forming a conductive material (e.g., tungsten, copper, or the like) in a semiconductor material where the conductive material may extend further to electrically couple with the first substrate 110 (e.g., bond pads 114).

FIG. 3E illustrates a formation of a channel 128 on the first sidewall 120S. FIG. 3E is taken along cross-sectional line AA' in FIG. 1A where the channel 128 resides. Referring to FIGS. 1D and 3E, the channel 128 has a width W1 of the first sidewall 120S, rather than an entire side of the sidewall 120S. Moreover, the channel 128 has a length substantially equal to the thickness of the first sidewall 120S. In some embodiments, an entire height of the first sidewall 120S is removed across the entire width W1 for the channel 128. In some embodiments, the channel 128 is formed during a single etching operation that also forms at least one element of the group constituting the first sidewall 120S, the second sidewall 120T, the first sensing element 126A and the second sensing element 126B.

In some embodiments in which a channel 129 is formed, a portion of the left-side peripheral portion 120P is recessed, as shown in FIG. 3F. The illustration of the channel 129 in FIG. 3F is for explanation purpose only although the channel 129 shown in FIG. 1C may not run through the sectional line AA' in FIG. 1A. Referring to FIGS. 1E and 3F, the channel 129 has a width W2 on the peripheral portion 120P, rather than an entire side of the peripheral portion 120P. Moreover, the channel 129 has a length substantially equal to the thickness of the peripheral portion 120P. In some embodiments, an entire height of the peripheral portion 120P is removed across the entire width W2 for the channel 129. In some embodiments, the channel 129 is formed during a single etching operation that also forms at least one element of the group constituting the first sidewall 120S, the second sidewall 120T, the first sensing element 126A and the second sensing element 126B.

Figure 3G:
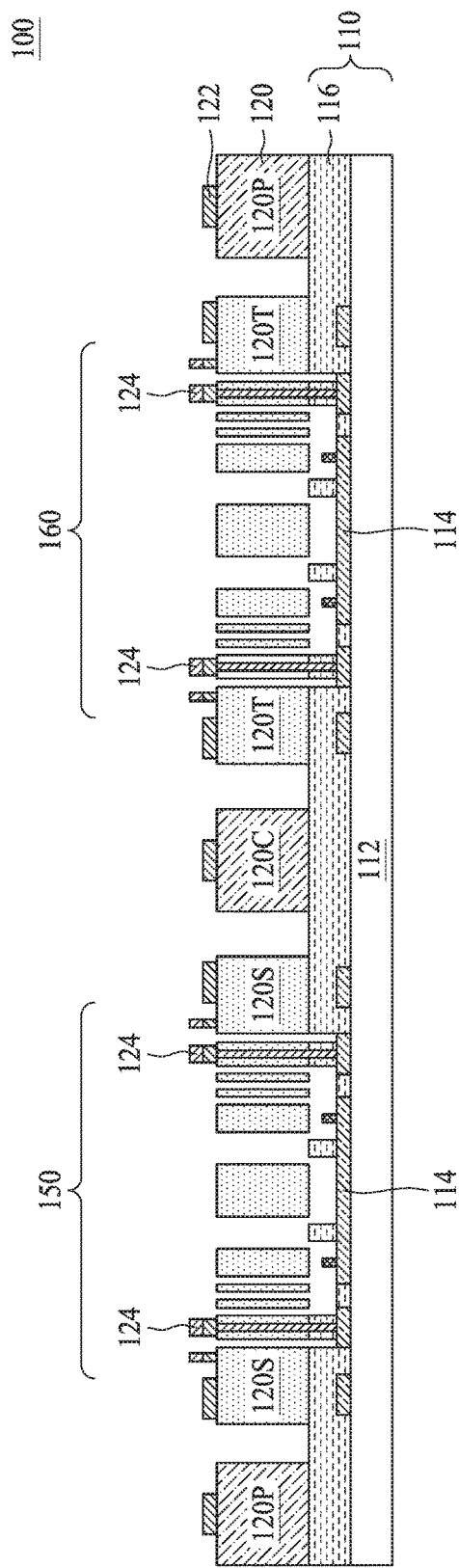

Referring to FIG. 3G, a first bonding layer 122 and a protection layer 124 are sequentially formed over the second substrate 120. The formation of the first bonding layer 122 and the protection layer 124 may be similar to that of the second bonding layer 132 with reference to FIG. 2A.

Figure 3H:
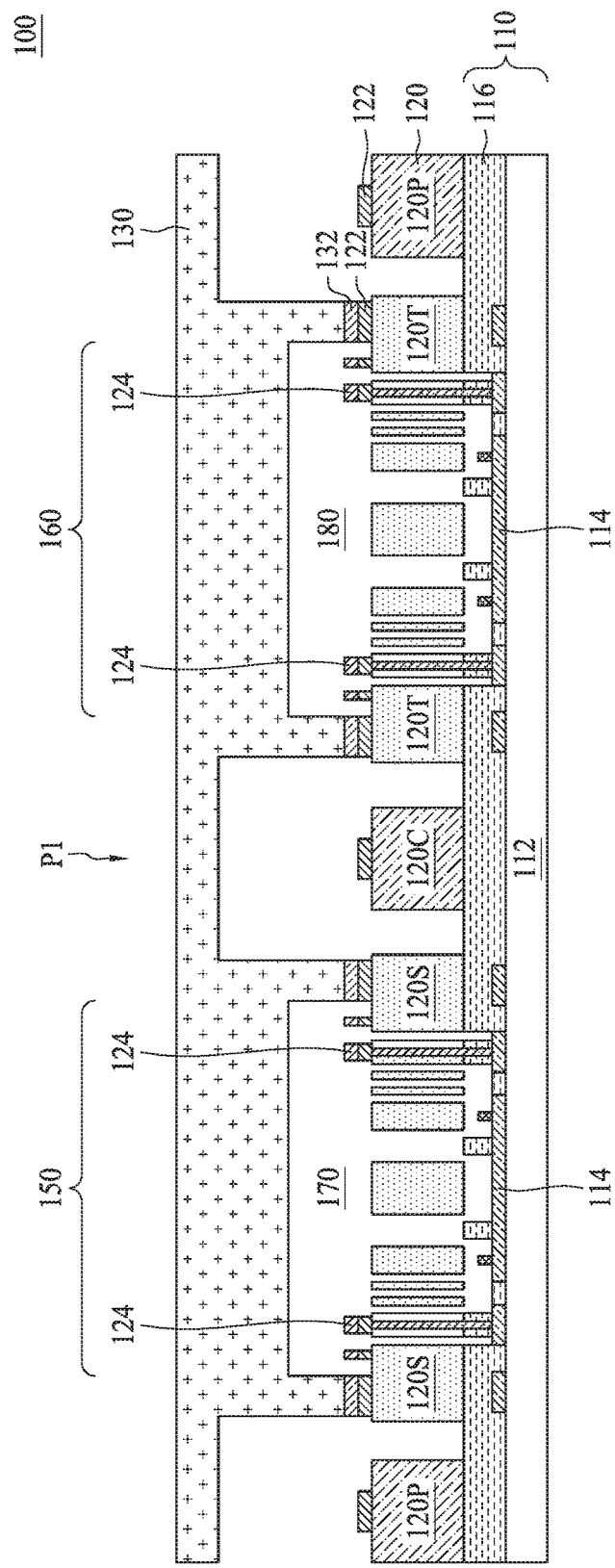

Next, the third substrate 130 is bonded to the second substrate 120 through the bonding layers 122 and 132, as shown in FIG. 3H. In some embodiments, the bonding operation includes eutectic bonding. In the meantime, a first cavity 170 and a second cavity 180 for the respective first component device 150 and the second component device 160 are formed accordingly. The first sidewall 120S laterally defines the scope and size of first cavity 170. The first cap substrate 130A covers and vertically defines the height of the first cavity 170. The second sidewall 120T laterally defines the scope and size of the second cavity 180. The second cap substrate 130B covers and vertically defines the height of the second cavity 180. In some embodiments, the bonding operation is performed at a first barometric pressure P1, e.g., vacuum or a high vacuum, such that the first cavity 170 and the second cavity 180 are kept at a substantial vacuum in the current stage.

Figure 3I:
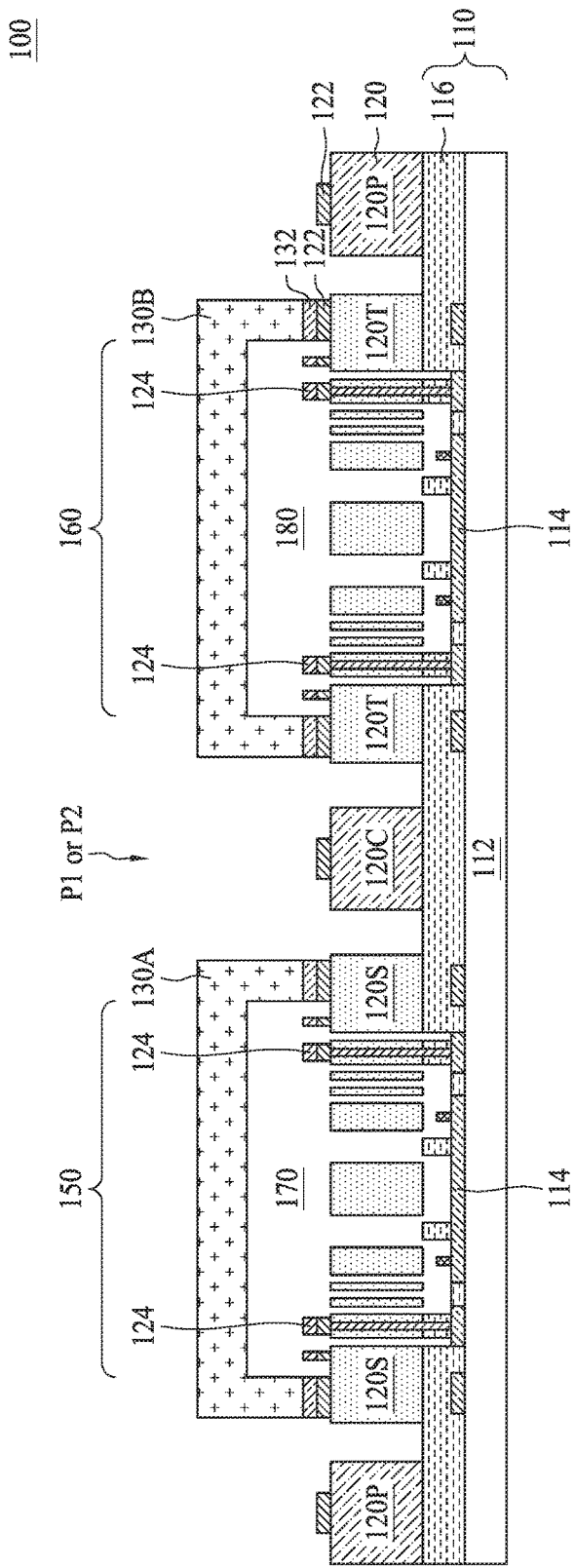

Subsequently, as shown in FIG. 3I, the third substrate 130 is recessed in order to form a first cap substrate 130A and a second cap substrate 130B. In some embodiments, a top portion of the third substrate 130 is thinned or removed to separate the first cap substrate 130A from the second cap substrate 130B. In some embodiments, the recessing of the third substrate 130 may be performed by an etch operation, such as a dry etching. In some embodiments, the recessing of the third substrate 130 is performed at a second barometric pressure P2 such that, due to the channel 128 for the first cavity 170, the first cavity 170 contains the second barometric pressure P2 different from the first barometric pressure P1 in the second cavity 180.

Figure 3J:
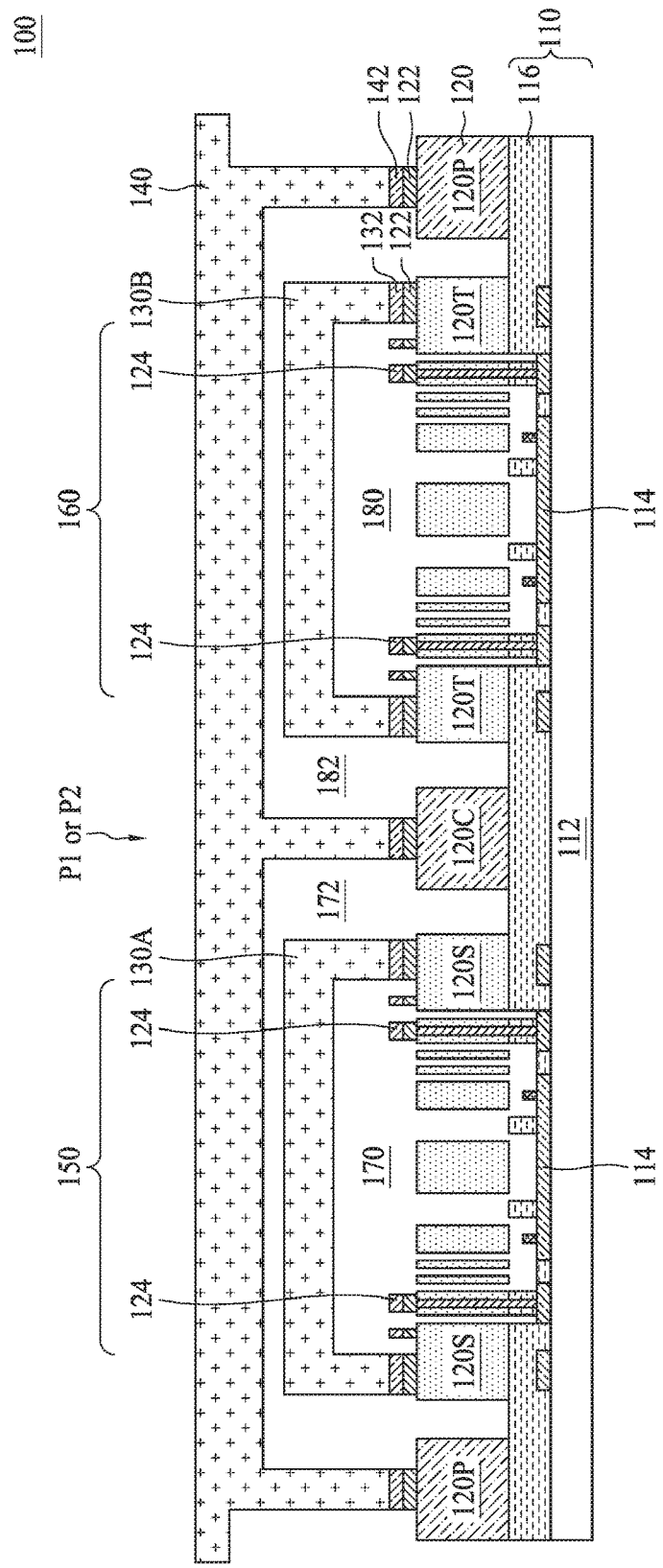
Figure 3K:
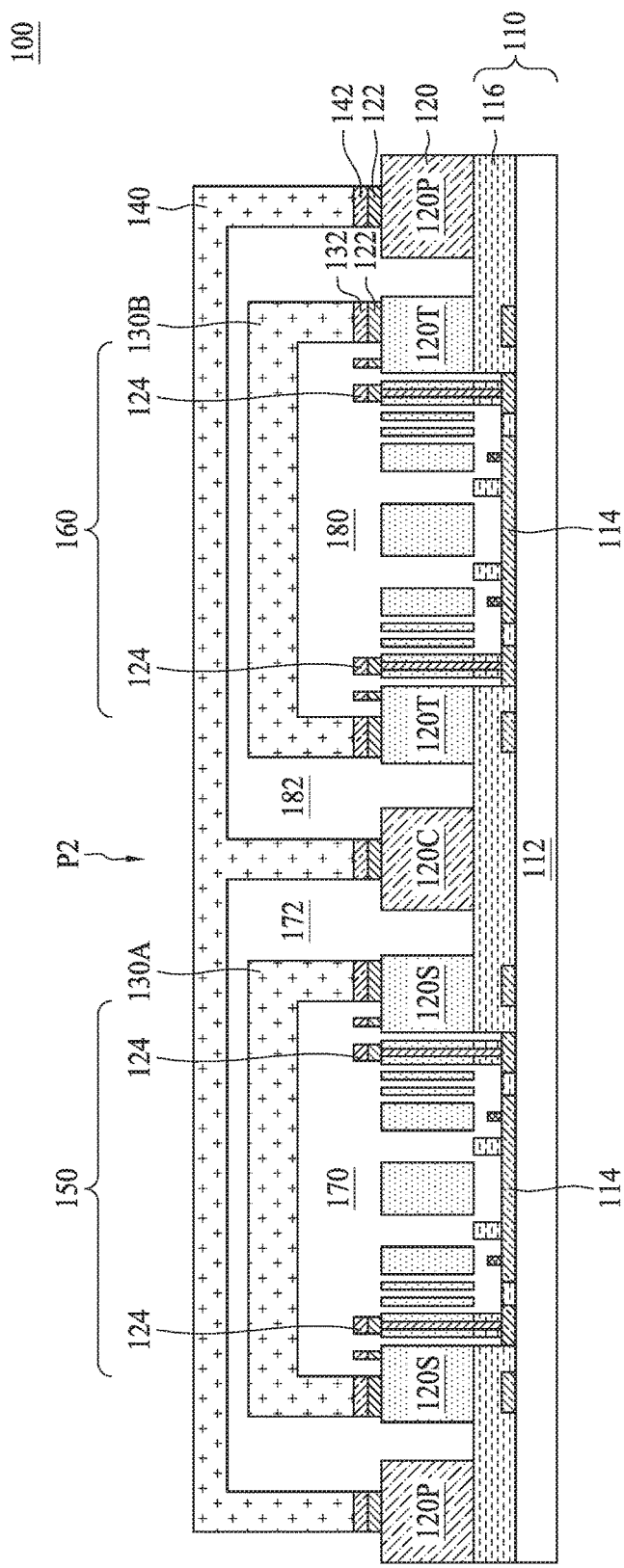

Next, the fourth substrate 140 is bonded to the second substrate 120 through the bonding layers 122 and 142, as illustrated in FIG. 3J. In some embodiments, the bonding operation includes eutectic bonding. In the meantime, a third cavity 172 and a fourth cavity 182 for the respective first component device 150 and the second component device 160 are formed accordingly. In some embodiments, the fourth substrate 140 is bonded to the second substrate 120 at the second barometric pressure P2. The third cavity 172 and the fourth cavity 182 may have the second barometric pressure accordingly. Subsequently, the fourth substrate 140 is recessed or thinned from a top surface and the MEMS device 100 is completed, as illustrated in FIG. 3K. In some embodiments, the recessing or thinning of the fourth substrate 130 may be performed by an etch operation, such as a dry etching, wet etching or RIE. The working pressure during the bonding and etching operation of the fourth substrate 140 may be kept at the second barometric pressure P2.

In some embodiments, the operational settings for the barometric pressures may be alternatively configured in the presence of the channel 144 on the fourth substrate 140 or the channel 129 on the second substrate 120. In some embodiments, the MEMS device 100 is kept at the first barometric pressure P1 while the first cap substrate 130A and the second cap substrate 130B are completed in FIG. 3I. In FIG. 3J, the fourth substrate 140 is bonded to the second substrate 120 at either the first barometric pressure P1 or the second barometric pressure P2. In a first example, assuming that the fourth substrate 140 is bonded at the first barometric pressure P1 in FIG. 3J, the fourth cavity 182 has the first barometric pressure P1. Next, during or subsequent to the recessing operation of the fourth substrate 140 as shown in FIG. 3K, the MEMS device 100 is exposed to the second barometric pressure P2, so that the cavities 170 and 172 are provided with a working pressure P2 through the channel 144 or 129, wherein the second barometric pressure P2 is different from the first barometric pressure P1 of the second cavity 180 and the fourth cavity 182.

In a second example, assuming that the fourth substrate 140 is bonded at the second barometric pressure P2 in FIG. 3J, the fourth cavity 182 has the second barometric pressure P2. During or subsequent to the recessing operation of the fourth substrate 140 as shown in FIG. 3K, the MEMS device 100 is kept at the second barometric pressure P2. As a result, the first cavity 170, the third cavity 180, and the fourth cavity 182 have the second barometric pressure P2 while the second cavity 182 has the first barometric pressure P1. The above-mentioned alternative arrangements allow for a greater manufacturing flexibility in determining the environmental pressures.

According to an embodiment of the present disclosure, a method of manufacturing a semiconductor device is provided. A first substrate is bonded with a second substrate. The second substrate is recessed to form a first sidewall and a first cavity laterally defined by the first sidewall. The second substrate is recessed to form a second sidewall and a second cavity laterally defined by the second sidewall. The second substrate is bonded with a third substrate at a first barometric pressure thereby forming the first cavity and the second cavity. The first sidewall is recessed to form a channel from the first cavity to an outer surface of the first sidewall. The third substrate is recessed and the first cavity is exposed to a second barometric pressure different from the first barometric pressure.

According to an embodiment of the present disclosure, a method of manufacturing a semiconductor device is provided. A first substrate is bonded with a second substrate. The second substrate is recessed to form a first sidewall and a first cavity laterally defined by the first sidewall. The second substrate is recessed to form a second sidewall and a second cavity laterally defined by the second sidewall. The second substrate is bonded with a first cap substrate and a second cap substrate bonding at a first barometric pressure, thereby forming the first cavity and the second cavity. The first sidewall is recessed to form a channel from the first cavity to an outer surface of the first sidewall. The first cavity is exposed to a second barometric pressure different from the first barometric pressure.

According to an embodiment of the present disclosure, a semiconductor device includes a first substrate and a second substrate bonded with the first substrate. The semiconductor device also includes a first cap substrate bonded with the second substrate, where a first cavity is formed between the first cap substrate and the second substrate. The semiconductor device further includes a second cap substrate bonded with the second substrate, where a second cavity is formed between the second cap substrate and the second substrate and the second cavity includes a first barometric pressure. Moreover, the semiconductor device includes a channel disposed on the second substrate, the first cavity and the channel comprising a second barometric pressure different from the first barometric pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   bonding a first substrate with a second substrate;
   recessing the second substrate to form a first sidewall and a first cavity laterally defined by the first sidewall;
   recessing the second substrate to form a second sidewall and a second cavity laterally defined by the second sidewall;
   bonding, at a first barometric pressure, the second substrate with a first cap substrate and a second cap substrate, thereby forming the first cavity and the second cavity;
   recessing the first sidewall to form a channel from the first cavity to an outer surface of the first sidewall;
   bonding a fourth substrate with the second substrate thereby forming a third cavity enclosing the first cavity and a fourth cavity enclosing the second cavity; and
   exposing the first cavity to a second barometric pressure different from the first barometric pressure through the third cavity subsequent to bonding the fourth substrate with the second substrate.

2. The method according to claim 1, wherein bonding the second substrate with a first cap substrate and a second cap substrate, thereby forming the first cavity and the second cavity, comprises bonding the second substrate with a third substrate and recessing the third substrate to form the first cap substrate and the second cap substrate separated from the first cap substrate.

3. The method according to claim 1, further comprising forming a sensing element in at least one of the first cavity and the second cavity.

4. The method according to claim 1, wherein bonding a fourth substrate with the second substrate comprises forming a second channel on the fourth substrate coupling the third cavity to an outer surface of the fourth substrate.

5. The method according to claim 1, wherein the channel and the first sidewall are formed during a single recessing operation.

6. The method according to claim 4, wherein bonding the fourth substrate with the second substrate comprises forming a first bonding layer and a second bonding layer on the second substrate and the fourth substrate, respectively, wherein the second channel extends through the second bonding layer and exposes a portion of the first bonding layer.

7. A method of manufacturing a semiconductor device, comprising:
   bonding a first substrate with a second substrate;
   recessing the second substrate to form a first sidewall and a first cavity defined by the first sidewall;
   recessing the second substrate to form a second sidewall and a second cavity defined by the second sidewall;
   bonding the second substrate with a cap substrate at a first barometric pressure, thereby forming the first cavity and the second cavity;
   recessing the first sidewall to form a channel from the first cavity to an outer surface of the first sidewall;
   recessing the cap substrate; and
   exposing the first cavity to a second barometric pressure different from the first barometric pressure,
   wherein the channel and the first sidewall are formed during a single recessing operation.

8. The method according to claim 7, wherein recessing the second substrate to form a first sidewall further comprises forming a first sensing element within the first cavity at the first barometric pressure.

9. The method according to claim 7, wherein bonding a first substrate with a second substrate comprises forming an oxide layer as a topmost layer of the first substrate and bonding the oxide layer with the second substrate.

10. The method according to claim 9, wherein the channel extends through a height of the second substrate and exposes a portion of the oxide layer.

11. The method according to claim 7, wherein bonding the second substrate with a cap substrate comprises forming a first bonding layer and a second bonding layer on the second substrate and the cap substrate, respectively, and bonding the second substrate with the cap substrate through the first bonding layer and the second bonding layer.

12. The method according to claim 11, wherein the channel extends through the first bonding layer and a height of the second substrate and exposes a portion of the second bonding layer.

13. The method according to claim 7, subsequent to recessing the cap substrate, further comprising bonding a third substrate with the second substrate, the third substrate covering the cap substrate.

14. The method according to claim 13, wherein bonding a third substrate with the second substrate is performed at the second barometric pressure.

15. The method according to claim 13, wherein bonding a third substrate with the second substrate comprises forming a second channel on the third substrate.

16. The method according to claim 7, wherein the channel comprises at least one corner.

17. The method according to claim 7, wherein the channel comprises a first section and a second section parallel with but not aligned with the first section.

18. A method of manufacturing a semiconductor device, comprising:
   bonding a first substrate with a second substrate;
   recessing the second substrate to form a first channel and a second channel;

bonding the recessed second substrate with a cap substrate at a first barometric pressure to form a first cavity and a second cavity, the first channel enabling access to the first cavity;

bonding the recessed second substrate with a third substrate at the first barometric pressure to form a third cavity and a fourth cavity enclosing the first cavity and the second cavity, respectively, the second channel communicating the third cavity to an outer surface of the second substrate; and exposing the bonded structure to a second barometric pressure, wherein sidewalls of the second substrate defining the first cavity, the second cavity and the first channel are formed using a single recessing operation.

19. The method according to claim 18, wherein bonding the recessed second substrate with a cap substrate at a first barometric pressure to form a first cavity and a second cavity comprises etching a thickness of the cap substrate to form two etched cap substrates separate from each other.

20. The method according to claim 18, further comprising forming sensing elements in the first cavity and the second cavity.

* * * * *